(12) United States Patent
Nagano

(10) Patent No.: US 9,529,331 B2
(45) Date of Patent: Dec. 27, 2016

(54) CONDUCTIVE MEMBER, SOLAR WATCH, SOLAR CELL MODULE, AND ELECTRONIC APPARATUS

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/540,613

(22) Filed: Nov. 13, 2014

(65) Prior Publication Data

US 2015/0138935 A1    May 21, 2015

(30) Foreign Application Priority Data

Nov. 19, 2013  (JP) ................................ 2013-238705
Aug. 26, 2014  (JP) ................................ 2014-171261

(51) Int. Cl.
*H01L 25/00*     (2006.01)
*G04C 10/02*    (2006.01)
*H01L 31/02*    (2006.01)

(52) U.S. Cl.
CPC ......... *G04C 10/02* (2013.01); *H01L 31/02008* (2013.01); *Y02E 10/50* (2013.01)

(58) Field of Classification Search
CPC ................. G04C 10/02; H01L 31/0687; H01L 31/02008; Y02E 10/50
USPC .................. 368/205; 439/388, 504, 522, 627
See application file for complete search history.

(56) References Cited

U.S. PATENT DOCUMENTS

| | | | | | |
|---|---|---|---|---|---|
| 3,427,797 A | * | 2/1969 | Negoro Akio | ......... | G04C 10/02 136/249 |
| 3,780,519 A | * | 12/1973 | Tokunaga | .............. | G04B 19/06 136/291 |
| 3,890,776 A | * | 6/1975 | Urushida | ............... | G04C 3/008 136/244 |

(Continued)

FOREIGN PATENT DOCUMENTS

| JP | A 11-186577 | 7/1999 |
|---|---|---|
| JP | A 2006-84317 | 3/2006 |

(Continued)

OTHER PUBLICATIONS

Insulator—wikipedia :: web.archive.org/web/20120816135719/ http://en.wikipedia.org/wiki/Insulator_(electricity)—Aug. 16, 2012.*

(Continued)

*Primary Examiner* — Sean Kayes
(74) *Attorney, Agent, or Firm* — Oliff PLC

(57) ABSTRACT

A solar cell module includes a first segment as a first solar cell segment and a second segment as a second solar cell segment disposed adjacent to each other, and each having electrodes respectively on both of obverse and reverse sides, and a conductive member including a base member having flexibility, a first conductive layer disposed on one surface of the base member, and a second conductive layer disposed on the other surface of the base member, and the base member is bent so as to connect the first conductive layer to the obverse side electrode of the first segment, and connect the second conductive layer to the reverse side electrode of the first segment and the obverse side electrode of the second segment.

18 Claims, 12 Drawing Sheets

(56) References Cited

U.S. PATENT DOCUMENTS

| | | | | |
|---|---|---|---|---|
| 4,354,115 | A * | 10/1982 | Warabisako | H01L 31/03528 136/244 |
| 4,483,910 | A * | 11/1984 | Julian | H01M 2/206 429/179 |
| 6,454,582 | B2 * | 9/2002 | Yamanashi | H01R 12/616 439/189 |
| 7,102,256 | B2 * | 9/2006 | Murakami | H02G 5/005 174/117 F |
| 7,663,979 | B2 * | 2/2010 | Meister | G04B 19/12 368/155 |
| 8,704,085 | B2 * | 4/2014 | Lockenhoff | H01L 31/048 136/244 |
| 8,873,345 | B2 * | 10/2014 | Takenawa | H01L 31/042 136/251 |
| 9,134,706 | B2 * | 9/2015 | Saito | G04C 10/02 |
| 2012/0057439 | A1 * | 3/2012 | Shimizu | G04C 10/02 368/205 |
| 2013/0258822 | A1 * | 10/2013 | Takenawa | H01L 31/042 368/205 |
| 2014/0060614 | A1 * | 3/2014 | Saito | H01L 31/0465 136/244 |
| 2014/0315441 | A1 * | 10/2014 | Kinoshita | H01M 2/1077 439/627 |

FOREIGN PATENT DOCUMENTS

| | | |
|---|---|---|
| JP | A 2008-224482 | 9/2008 |
| JP | A 2013-122423 | 6/2013 |
| JP | A 2013-195269 | 9/2013 |
| JP | A 2013-213719 | 10/2013 |

OTHER PUBLICATIONS

Explain why metal wire coated with plastic or rubber is used in electric circuits—Yahoo Answers :: answers.yahoo.com/question/index?qid=20081211135139AAZ1Up4—2008.*

Wire and Cable—Home Depot—web.archive.org/web/20120308214336/http://www.homedepot.com/webapp/catalog/servlet/ContentView?pn=Wire&storeId=10051&langId=-1&catalogId=10053&cm_sp=d27-_-Commerce-_-Electrical-_-Subcat-_-Wires_Cable-_-Hero—Mar. 8, 2012.*

* cited by examiner

CONDUCTIVE MEMBER, SOLAR WATCH, SOLAR CELL MODULE, AND ELECTRONIC APPARATUS

CROSS-REFERENCE TO RELATED APPLICATION

This application claims a priority to Japanese Patent Applications {No. 2013-238705 filed on Nov. 19, 2013 and No. 2014-171261 filed on Aug. 26, 2014} which are hereby expressly incorporated by reference in its entirety.

BACKGROUND

1. Technical Field

Several aspects the present invention relate to a conductive member, a solar watch, a solar cell module, and an electronic apparatus.

2. Related Art

In the past, regarding the mounting of the electrode contact of a mobile solar cell, there have been devised a variety of shapes in order to lead the contacts of a transparent electrode disposed on a visual side and an opposed electrode disposed on an opposite surface side to the same surface. For example, in an invention disclosed in JP-A-2008-224482 (Document 1), a through hole is provided to a base member itself. Further, in the mobile solar cell, it is important to increase the voltage when generating electrical power. Therefore, in the past, there has been known a structure of connecting a plurality of solar cells in series to each other using metal "In" in order to increase the generated voltage (see e.g., JP-A-11-186577 (Document 2)).

However, since the invention disclosed in Document 1 mentioned above requires a hole making work, a terminal insulation process, and a hole filling process with conductive paste, the process is complicated, and therefore, there is a problem of degradation of reliability or increase in cost due to degradation of the yield ratio. Further, in an invention disclosed in Document 2, in the case of trying to keep sufficient connection strength using metal In, there is a problem that conduction failure occurs due to a breakage of a power-generating layer with extremely thin film thickness.

SUMMARY

An advantage of some aspects of the invention is to solve at least a part of the problems described above, and can be implemented as the following aspects and application examples. Another advantage of some aspects of the invention is to provide a conductive member and a solar watch with which high conduction (connection) reliability can be obtained at low cost.

Application Example

This application example is directed to a conductive member adapted to electrically connect a first battery cell and a second battery cell disposed adjacent to each other, and each having electrodes on both of obverse and reverse sides, the conductive member including a base member having flexibility, a first conductive layer disposed on one surface of the base member, and a second conductive layer disposed on the other surface of the base member, and the base member is bent so as to connect the first conductive layer to the obverse side electrode of the first battery cell, and connect the second conductive layer to the reverse side electrode of the first battery cell and the obverse side electrode of the second battery cell.

According to this application example, the arrangement of the wiring layer in the electrical connection between the obverse side electrode of the first battery cell and the reverse side electrode of the second battery cell, and the serial connection between the two battery cells can be realized by the single conductive member. Therefore, a reduction in the number of components, or a reduction in man-hour for the connection operation can be achieved, and as a result, the cost reduction can be achieved. Further, since the conductive member is formed mainly of the flexible base member, the arrangement of the first conductive layer and the second conductive layer is simply and surely achieved, and thus, the connection reliability between the first battery cell and the second battery cell can be improved.

The conductive member according to the application example described above may be configured such that the first battery cell is provided with a first cutout, and the second battery cell is provided with a second cutout, the base member includes a main body section, and a first extending section and a second extending section extending from the main body section in respective directions different from each other, the first extending section of the base member is bent at the first cutout, and pulled out toward the obverse side of the first battery cell, and a part of the first conductive layer disposed on the first extending section is connected to the obverse side electrode of the first battery cell, the second extending section of the base member is bent at the second cutout, and pulled out toward the obverse side of the second battery cell, and a part of the second conductive layer disposed on the second extending section is connected to the obverse side electrode of the second battery cell, and the main body section of the base member is located on the reverse side of the first battery cell and the second battery cell between the first cutout and the second cutout, and a part of the second conductive layer disposed on the main body section is connected to the reverse side electrode of the first battery cell.

According to this configuration, even if it is difficult to pull out the conductive member from the gap between the first battery cell and the second battery cell adjacent to each other, it is possible to pull out the extending sections from the cutouts provided to the respective battery cells to connect the extending sections to the respective obverse side electrodes of the first battery cell and the second battery cell. In other words, even if the first battery cell and the second battery cell are disposed close to each other, it becomes possible to electrically connect the battery cells in series to each other.

The conductive member according to the application example described above may be configured such that at least one of the first conductive layer and the second conductive layer is connected to one of the obverse side electrode of the first battery cell, the obverse side electrode of the second battery cell, and both of the obverse side electrode of the first battery cell and the obverse side electrode of the second battery cell via at least one through hole provided to the base member.

According to this configuration, it is possible to provide a high-value-added conductive member capable of achieving the electrical connection without bending the connection section to the obverse side electrode with respect to at least either one of the first conductive layer and the second conductive layer.

The conductive member according to the application example described above may be configured such that the first conductive layer and the second conductive layer are covered with an insulating layer in at least a part where the base member is bent.

According to this configuration, it is possible to avoid the short circuit, which is caused by the contact of the first conductive layer or the second conductive layer with the first battery cell or the second battery cell, using the insulating layer.

The conductive member according to the application example described above may be configured such that the first battery cell and the second battery cell are each a solar cell segment.

According to this configuration, it is possible to provide a conductive member simply and surely making it possible to connect the electrodes on the obverse and reverse sides of the two solar cell segments in series to each other.

Application Example

This application example is directed to a solar watch including a solar cell module including a pair of solar cell segments, and the conductive member according to the application example described above adapted to connect the pair of solar cell segments in series to each other, and a drive section driven with electrical power from the solar cell module.

According to this application example, since the solar cell module having the pair of solar cell segments connected in series to each other with high reliability using the conductive member is provided, a high drive voltage can be obtained compared to the case of using a single solar cell segment. Therefore, the solar watch, which can be driven with stable electrical power, and is therefore high in reliability, can be provided at low cost.

The solar watch according to the application example described above may be configured such that the conductive member is disposed in a state of being pulled out to both of the sides of the pair of solar cell segments via cutouts provided respectively to the pair of solar cell segments.

According to this configuration, it is possible to realize the structure of simply and surely achieving the connection on both sides of the solar cell segment using the conductive member. In other words, it is possible to realize the structure capable of obtaining the output from the solar cell module on the reverse side of the pair of solar cell segments. Therefore, a low profile and simple structure can be obtained compared to the structure of taking out the output from the obverse side and the reverse side of the solar cell module.

The solar watch according to the application example described above may be configured such that the solar watch further includes a power supply device including a secondary cell, and the first conductive layer connected to the obverse side electrode of one of the pair of solar cell segments, and the reverse side electrode of the other of the pair of solar cell segments are connected to the power supply device so as to be able to charge the secondary cell.

According to this configuration, since the electrical power generated by the pair of solar cell segments can be stored in the secondary cell, it is possible to provide a solar watch capable of accurately ticking even in a dark place such as nighttime difficult to obtain the electrical power from the pair of solar cell segments.

Application Example

This application example is directed to a solar cell module including a first solar cell segment and a second solar cell segment disposed adjacent to each other, and each having electrodes respectively on both of obverse and reverse sides, and a conductive member including a base member having flexibility, a first conductive layer disposed on one surface of the base member, and a second conductive layer disposed on the other surface of the base member, and the base member is bent so as to connect the first conductive layer to the obverse side electrode of the first solar cell segment, and connect the second conductive layer to the reverse side electrode of the first solar cell segment and the obverse side electrode of the second solar cell segment.

According to this application example, since the two solar cell segments are connected in series to each other with the conductive member, it is possible to obtain a high drive voltage compared to the case of using a single solar cell segment, and at the same time, provide the solar cell module having high connection reliability.

The solar cell module according to the application example described above may be configured such that the solar cell module further includes a first cutout provided to the first solar cell segment, and a second cutout provided to the second solar cell segment, the base member includes a main body section, and a first extending section and a second extending section extending from the main body section in respective directions different from each other, the first extending section of the base member is bent at the first cutout, and pulled out toward the obverse side of the first solar cell segment, and a part of the first conductive layer disposed on the first extending section is connected to the obverse side electrode of the first solar cell segment, the second extending section of the base member is bent at the second cutout, and pulled out toward the obverse side of the second solar cell segment, and a part of the second conductive layer disposed on the second extending section is connected to the obverse side electrode of the second solar cell segment, and the main body section of the base member is located on the reverse side of the first solar cell segment and the second solar cell segment between the first cutout and the second cutout, and a part of the second conductive layer disposed on the main body section is connected to the reverse side electrode of the first solar cell segment.

According to this configuration, even if it is difficult to pull out the conductive member from the gap between the first solar cell segment and the second solar cell segment adjacent to each other, it is possible to pull out the extending sections from the cutouts provided to the respective solar cell segments to connect the extending sections to the respective obverse side electrodes of the first solar cell segment and the second solar cell segment. In other words, it is possible to provide the solar cell module in which the first solar cell segment and the second solar cell segment can electrically be connected in series to each other even if the first solar cell segment and the second solar cell segment are disposed close to each other.

The solar cell module according to the application example described above may be configured such that the first cutout and the second cutout are disposed across a gap between the first solar cell segment and the second solar cell segment adjacent to each other.

According to this configuration, the connection distance between the first solar cell segment and the second solar cell segment with the conductive member can relatively be shortened. In other words, the electrical power loss due to the interconnection resistance of the conductive member can be reduced.

The solar cell module according to the application example described above may be configured such that at least one of the first cutout and the second cutout is a hole penetrating one of the first solar cell segment, the second solar cell segment, and both of the first solar cell segment and the second solar cell segment.

According to this configuration, since one of the first extending section, the second extending section, and both of the first extending section and the second extending section are pulled out from the hole as the cutout, the pull-out position is difficult to shift, and it is possible to reduce the degradation of the connection reliability due to an external force.

The solar cell module according to the application example described above may be configured such that the second cutout forms a part of the gap between the first solar cell segment and the second solar cell segment adjacent to each other.

According to this configuration, by disposing the second cutout in the second solar cell segment facing the gap, the first solar cell segment and the second solar cell segment can be connected in series to each other with the conductive member using the gap, and therefore, the connection distance between the first solar cell segment and the second solar cell segment can further be shortened.

The solar cell module according to the application example described above may be configured such that the first extending section and the second extending section each have a first branch end portion and a second branch end portion, the first branch end portion of the first extending section is pulled out toward the obverse side of the first solar cell segment through the first cutout, and a part of the first conductive layer disposed on the first branch end portion is connected to the obverse side electrode of the first solar cell segment, the first branch end portion of the second extending section is pulled out toward the obverse side of the second solar cell segment through the second cutout, and a part of the second conductive layer disposed on the first branch end portion is connected to the obverse side electrode of the second solar cell segment, and the second branch end portions of the first extending section and the second extending section are disposed on the reverse side of the first solar cell segment and the second solar cell segment adjacent to each other.

According to this configuration, since the first branch end portion is pulled out toward the obverse side and the second branch end portion is disposed on the reverse side, it is possible to sandwich the solar cell segment with the first branch end portion and the second branch end portion to thereby support the solar cell segment compared to the case of pulling out the end portions of the first extending section and the second extending section through the respective cutouts. In other words, a more robust electrical connection structure of the first solar cell segment and the second solar cell segment can be realized.

The solar cell module according to the application example described above may be configured such that the conductive member has a side section having a shape along outer edges of the first solar cell segment and the second solar cell segment adjacent to each other.

According to this configuration, when connecting the first solar cell segment and the second solar cell segment to each other with the conductive member, the conductive member becomes more difficult to run off the outer edge of the first solar cell segment and the second solar cell segment, and the solar cell module smaller in size can be provided.

Application Example

This application example is directed to an electronic apparatus including the solar cell module according to any one of the application examples described above.

According to this application example, a higher drive voltage can be obtained compared to the case of using a single solar cell segment, and at the same time, since the solar cell module having high connection reliability is provided, an electronic apparatus having high reliability can be provided at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
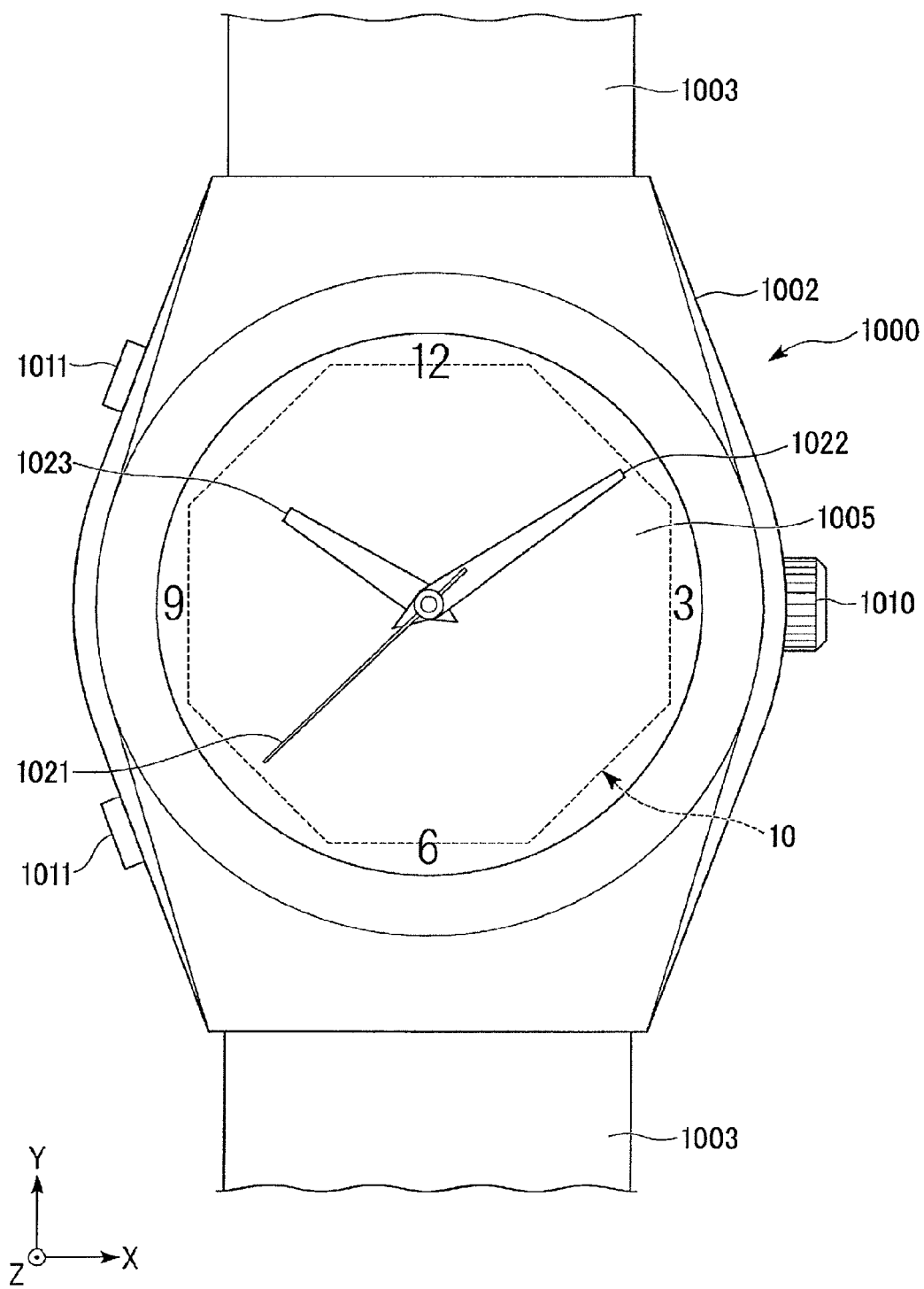
FIG. 1 is a plan view showing a schematic configuration of a solar watch according to a first embodiment of the invention.

A conductive member and a solar watch according to some embodiments of the invention will hereinafter be explained with reference to the accompanying drawings. In the embodiments, the explanation will be presented showing a watch provided with a solar cell module having two solar cell segments conductively connected (electrically connected) to each other with the conductive member according to the invention as an example of the solar watch.

It should be noted that the scope of the invention is not limited to the embodiments hereinafter described, but can arbitrarily be modified within the technical idea or the technical concept of the invention. Further, in the drawings hereinafter explained, the actual structures and the structures of the drawings might be made different from each other in scale size, number, and so on in order for making each constituent easy to understand.

First Embodiment

Solar Watch

Firstly, the solar watch according to the present embodiment to which the solar cell module 10 according to the present embodiment is applied will be explained. It should be noted that in the following explanations, an XYZ coordinate system is assumed, and positional relationships between the respective members will be explained with reference to the XYZ coordinate system. On this occasion, it is assumed that a direction perpendicular to a principal surface of a watch dial 1005 (see FIG. 1) of the watch is the Z-axis direction, a direction perpendicular to the Z-axis direction and identical to the 12 o'clock to 6 o'clock direction in the watch dial 1005 is the Y-axis direction, and a direction perpendicular to the Z-axis direction and the Y-axis direction, namely a direction identical to the 3 o'clock to 9 o'clock direction in the watch dial 1005, is the X-axis direction.

In the present embodiment, the watch will be described as an example of the solar watch to which the solar cell module 10 is applied.

Figure 2:
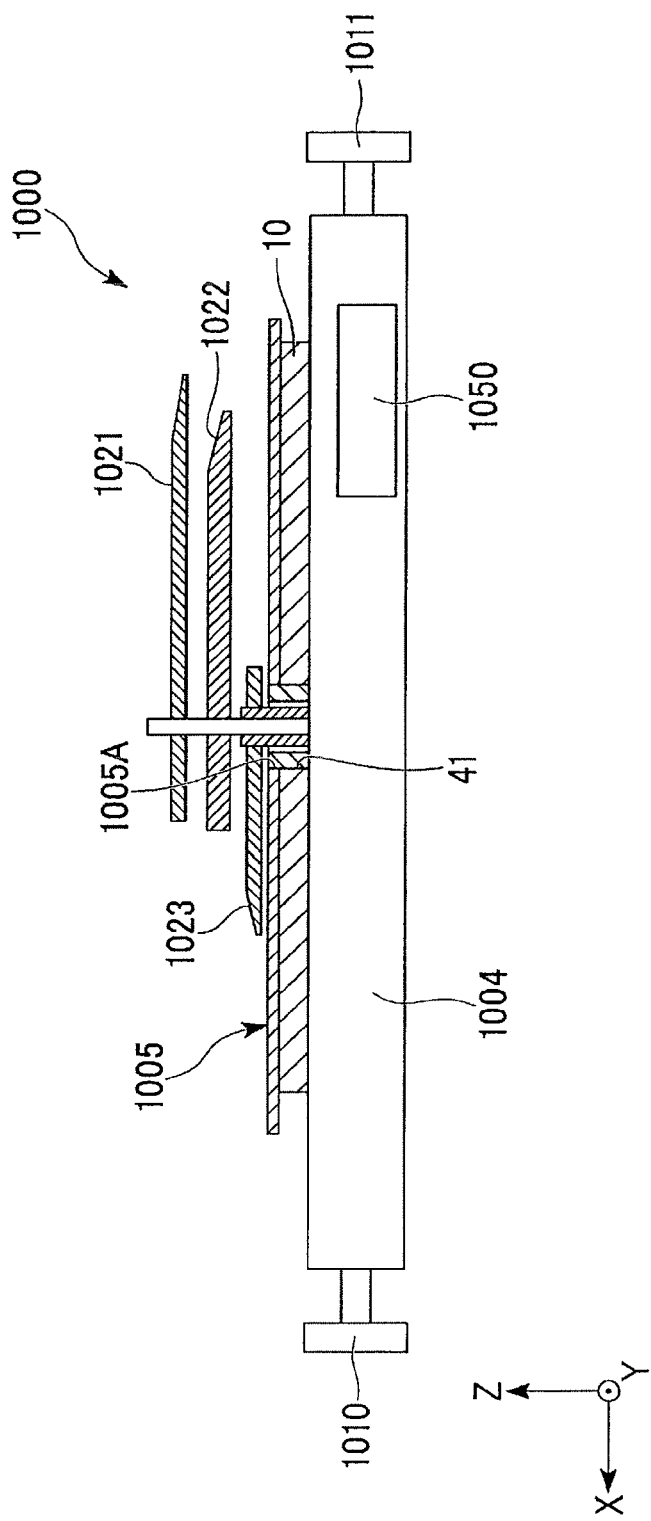
FIG. 2 is a cross-sectional view of the solar watch according to the first embodiment.

FIGS. 1 and 2 are diagrams showing the watch 1000 according to the present embodiment to which the solar cell module 10 is applied. FIG. 1 is a plan view, and FIG. 2 is a cross-sectional view.

As shown in FIG. 1, the watch 1000 as the solar watch according to the present embodiment is configured including a watch case 1002, and a pair of bands 1003 connected to the watch case 1002. The watch case 1002 is formed of a metal material such as stainless-steel or a resin material such as a plastic resin, and houses a movement (drive section) 1004, the watch dial 1005, and the solar cell module 10 in the inside thereof as shown in FIG. 2.

On the watch dial 1005 side (an obverse side of the watch, +Z side) in the watch case 1002, a transparent cover (not shown) made of glass or resin is fixed by press-fit via a press-fit ring (not shown) made of resin or metal. Further, on the movement 1004 side (a reverse side of the watch, −Z side) in the watch case 1002, a case back (not shown) is threadably mounted via a gasket (not shown), thus the airtightness of the inside of the watch case 1002 is ensured by the case back and the transparent cover.

Further, as shown in FIG. 1, the watch case 1002 is provided with a crown 1010 and two operation buttons 1011. The crown 1010 is disposed so as to be able to be pushed and pulled in multiple stages (two stages in the present embodiment), and to be able to rotate.

As shown in FIG. 2, the movement 1004 is provided with a second hand 1021, a minute hand 1022, an hour hand 1023, and a power supply device 1050. The second hand 1021, the minute hand 1022, and the hour hand 1023 are arranged coaxially. In other words, shafts on which the second hand 1021, the minute hand 1022, and the hour hand 1023 are respectively disposed are arranged so as to be coaxial with each other. The shafts on which the second hand 1021, the minute hand 1022, and the hour hand 1023 are respectively disposed projects upward (+Z side) from the watch dial 1005 via a through hole 41 provided to the solar cell module 10 and a through hole 1005A provided to the watch dial 1005.

The power supply device 1050 supplies the movement 1004 with electrical power. The power supply device 1050 includes a secondary cell (not shown) charged by the solar cell module 10.

The watch dial 1005 is a flat plate on which characters representing time are displayed. In FIG. 1, only the time display of 12 o'clock, 3 o'clock, 6 o'clock, and 9 o'clock is shown.

The watch dial 1005 has a light transmissive property. The light transmittance of the watch dial 1005 is, for example, 20%.

The solar cell module 10 is disposed between the watch dial 1005 and the movement 1004.

Solar Cell Module

Figure 3:
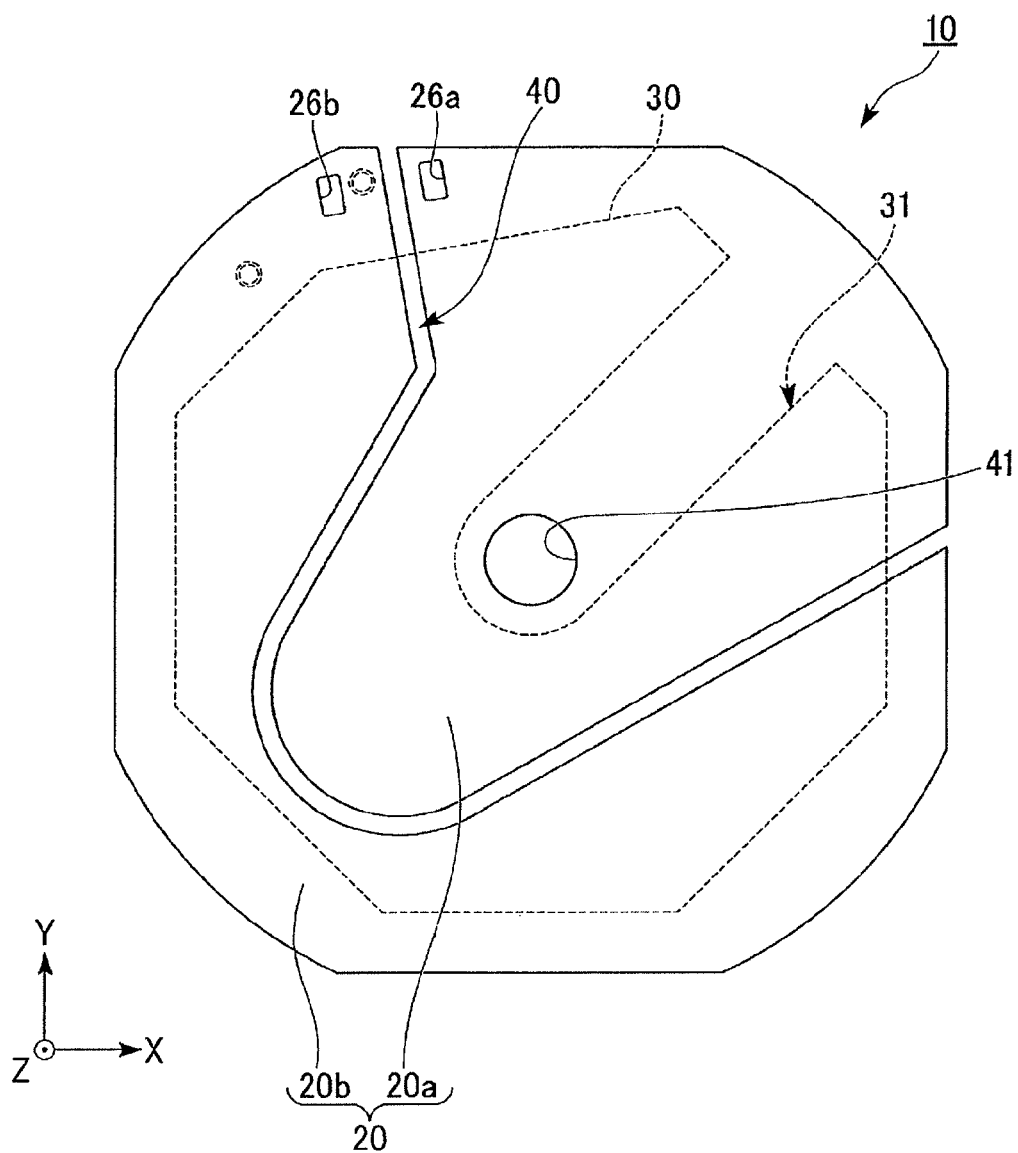
FIG. 3 is a plan view of a solar cell module according to the first embodiment.
Figure 4:
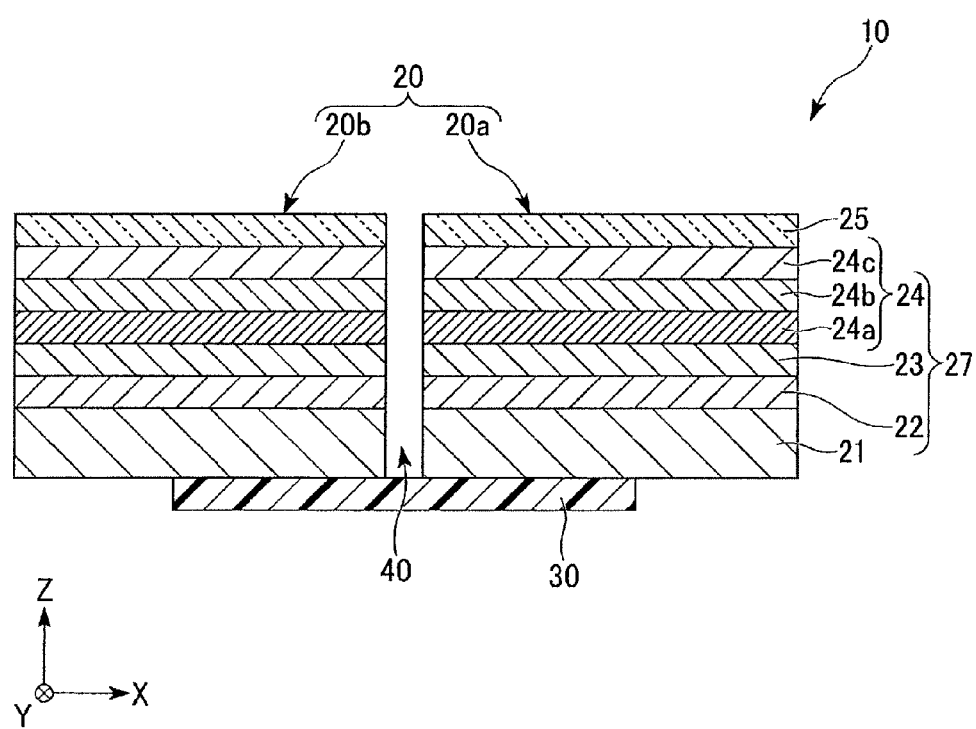
FIG. 4 is a cross-sectional view of the solar cell module according to the first embodiment.

FIG. 3 is a plan view of the solar cell module 10, and FIG. 4 is a cross-sectional view of the solar cell module 10.

As shown in FIG. 3, the solar cell module 10 according to the present embodiment is provided with a solar cell panel 20 and a flexible substrate 30. The solar cell panel 20 is a laminate panel for generating electrical power when receiving the solar light. In the present embodiment, the solar cell panel 20 has a roughly regular octagon shape in a planar view (an X-Y plane view). The bending elasticity of the solar cell panel 20 is higher than the bending elasticity of the flexible substrate 30. It should be noted that the shape of the solar cell panel 20 is not limited to the roughly regular octagon.

The solar cell panel 20 is provided with a parting line section 40 formed of a linear gap, and the through hole 41 for disposing the watch hands. The solar cell panel 20 is segmented by the parting line section 40 into a plurality of segments. The parting line section 40 is formed so as not to pass through the through hole 41.

In the present embodiment, the solar cell panel 20 is segmented by the parting line section 40 into two segments, namely a first segment (a first cell, a solar cell segment) 20a and a second segment (a second cell, a solar cell segment) 20b. In the present embodiment, the first segment 20a is disposed on the right (+X direction) in a planar view in FIG. 3, and the second segment 20b is disposed on the left (−X direction) in the planar view. The first segment 20a includes the center of the solar cell panel 20. The through hole 41 is formed at the center of the solar cell panel 20. Therefore, the through hole 41 is provided to the first segment 20a.

The width of the parting line section 40 is, for example, not smaller than 0.1 mm and not larger than 0.3 mm. By setting the width of the parting line section 40 within this value range, it becomes easier to suppress bending of the flexible substrate 30. It should be noted that the shape of the parting line section 40 is not limited to the configuration shown in FIG. 3. In other words, the shapes of the first segment 20a and the second segment 20b are not limited to the configuration shown in FIG. 3.

As shown in FIG. 4, the solar cell panel 20 (the first segment 20a and the second segment 20b) is configured by stacking an SUS substrate (a reverse side electrode) 21, an aluminum layer (an Al layer) 22, a zinc oxide (a ZnO layer) 23, a power-generating layer 24, and an ITO film layer (a transparent conductive film layer) 25 in this order. Light enters the solar cell panel 20 from the ITO film layer 25 side (+Z side). It should be noted that the ITO film layer 25 (the obverse side electrode) functions as a positive electrode in the present embodiment.

Meanwhile, the SUS substrate 21 is a substrate functioning as a negative electrode in the present embodiment.

The aluminum layer 22 is a layer provided with irregularity formed on the surface facing the zinc oxide layer 23, and for scattering and reflecting light transmitted through the power-generating layer 24 out of the solar light having entered the solar cell panel 20 from the ITO film layer side (+Z side).

The zinc oxide layer 23 is a layer for adjusting the refractive index of the light between the power-generating layer 24 and the aluminum layer 22.

The power-generating layer 24 is a multi-junction power-generating layer having a three-layer structure (a triple junction structure), for example, in the present embodiment. The power-generating layer 24 is provided with a first amorphous silicon germanium layer (a-SiGe layer) 24a, a second amorphous silicon germanium layer 24b, and an amorphous silicon layer (a-Si layer) 24c stacked in this order from the zinc oxide layer 23 side (−Z side).

The first amorphous silicon germanium layer 24a and the second amorphous silicon germanium layer 24b are each formed by doping germanium into amorphous silicon. An amount of germanium doped in the first amorphous silicon germanium layer 24a and an amount of germanium doped in the second amorphous silicon germanium layer 24b are different from each other. The first amorphous silicon germanium layer 24a, the second amorphous silicon germanium layer 24b, and the amorphous silicon layer 24c are set to be different in absorption wavelength band from each other.

In the present embodiment, the aluminum layer 22, the zinc oxide layer 23, and the power-generating layer 24 are collectively referred to as a solar cell main body 27.

The ITO film layer 25 is a transparent conductive film layer functioning as a positive electrode in the present embodiment.

The flexible substrate 30 is made to adhere to the SUS substrate 21 of the solar cell panel 20 so as to connect the first segment 20a and the second segment 20b to each other.

As shown in FIG. 3, the flexible substrate 30 has a shape obtained by partially cutting the roughly regular octagon with a cutout section 31 in the planar view (the X-Y plane view).

The cutout section 31 is a belt-like cutout having a circular arc shape in an end portion near to the center of the solar cell panel 20 in the planar view (the X-Y plane view). The cutout section 31 is formed so as to reach the center of the flexible substrate 30. The flexible substrate 30 is made to adhere to the solar cell panel 20 so as not to overlap the through hole 41. In other words, the flexible substrate 30 is made to adhere to the solar cell panel 20 so that the through hole 41 is disposed inside the cutout section 31.

Further, although not shown in the drawings in the present embodiment, the solar cell panel 20 is provided with a through hole for a date window in some cases. In such a case, the flexible substrate 30 is made to adhere so as not to overlap the through hole for the data window in the planar view (the X-Y plane view). Further, the flexible substrate 30 is made to adhere so that, for example, the through hole for the date window is disposed inside the cutout section 31 of the flexible substrate 30.

The area of the flexible substrate 30 in the planar view (the X-Y plane view) is smaller than the area of the solar cell panel 20 in the planar view (the X-Y plane view). Further, the bending elasticity of the flexible substrate 30 is lower than the bending elasticity of the solar cell panel 20.

The first segment 20a and the second segment 20b are respectively provided with cutouts 26a, 26b each having a roughly rectangular shape in the planar view. The cutouts 26a, 26b are for attaching the conductive member according to the present embodiment as described later. The first segment 20a and the second segment 20b are connected in series to each other with the conductive member. It should be noted that the graphical description of the conductive member is omitted in FIG. 3.

Conductive Member

Figure 5A:
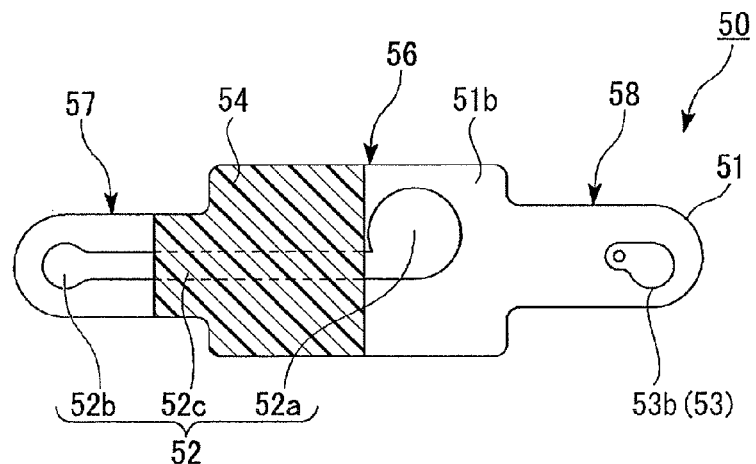
FIGS. 5A through 5C are schematic configuration diagrams of a conductive member according to the first embodiment.
Figure 5B:
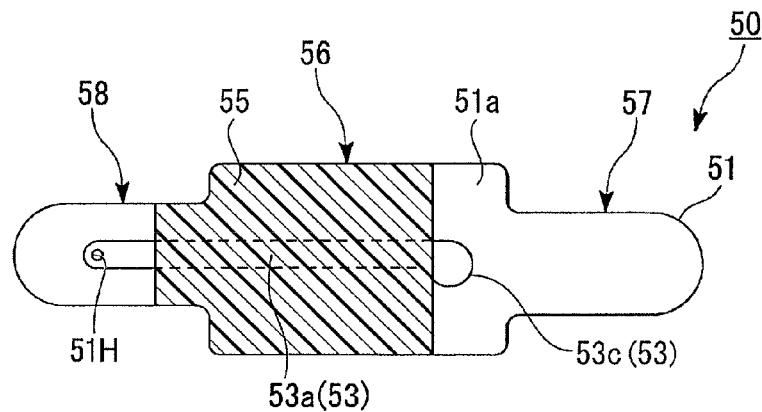
Figure 5C:
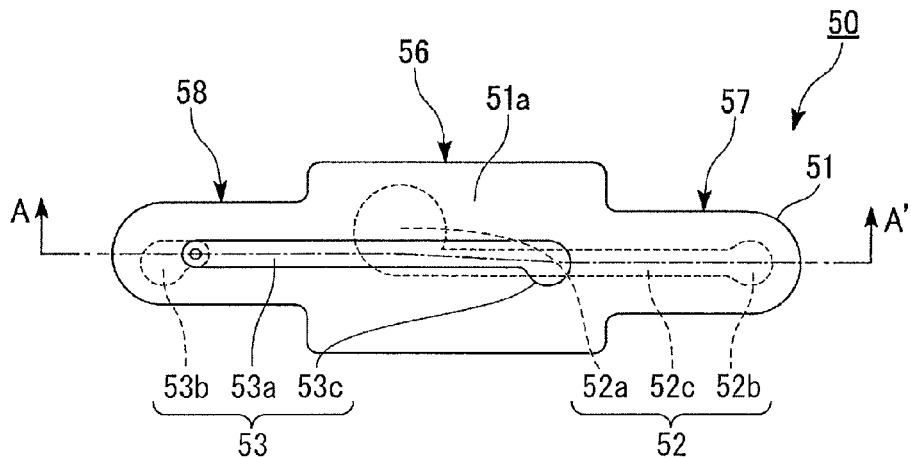
Figure 6:
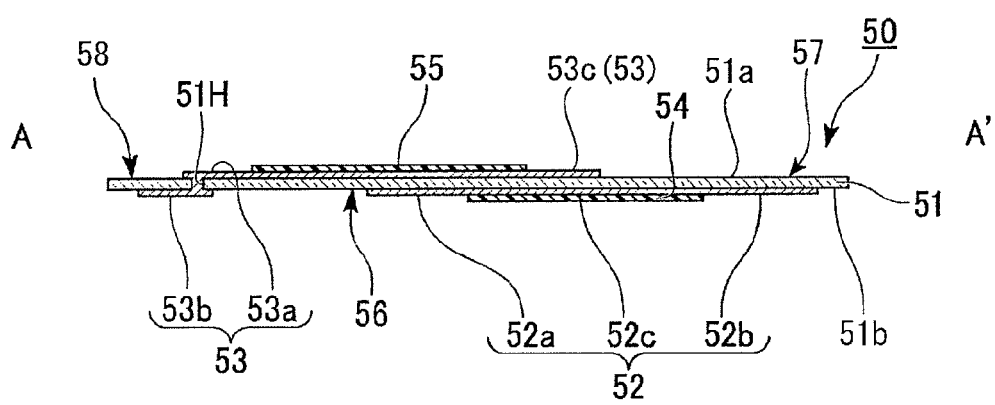
FIG. 6 is a cross-sectional view of the conductive member according to the first embodiment.

Secondary, the conductive member for connecting the first segment 20a and the second segment 20b in series to each other will be explained. FIGS. 5A through 5C are diagrams showing a configuration of the conductive member 50, wherein FIG. 5A is a plan view of the conductive member 50 viewed from the reverse side, FIG. 5B is a plan view of the conductive member 50 viewed from the obverse side, and FIG. 5C is a diagram showing an arrangement relationship between the conductive layers on the both sides in the case of viewing the conductive member 50 from the obverse side. FIG. 6 is a diagram showing a cross-sectional configuration of the conductive member 50 along the A-A' arrowed line shown in FIG. 5C. It should be noted that in FIG. 5C, in order to make the drawing eye-friendly, the graphical description of insulating layers respectively covering conductive layers is omitted.

As shown in FIG. 6, the conductive member 50 according to the present embodiment is provided with a film base member (a flexible base member) 51, a first conductive layer 52 disposed on a reverse surface 51b (one surface) of the film base member 51, a second conductive layer 53 drawn to the both surfaces, namely an obverse surface 51a (the other surface) and the reverse surface 51b (the one surface), of the film base member 51, an insulating layer 54 for partially covering the first conductive layer 52, and an insulating layer 55 for partially covering the second conductive layer 53. The first conductive layer 52 and the second conductive layer 53 are each formed of, for example, a copper foil or the like.

As shown in FIGS. 5A through 5C, the film base member 51 includes a main body section 56, and a first extending section 57 and a second extending section 58 extending from both ends of the main body section 56. In a direction intersecting with the extending direction of the first extending section 57 and the second extending section 58, the width of the main body section 56 is larger than the width of the first extending section 57 and the second extending section 58. The first extending section 57 is pulled out through the cutout 26a provided to the first segment 20a when connecting the first segment 20a and the second segment 20b in series to each other. Further, the second extending section 58 is pulled out through the cutout 26b provided to the second segment 20b when connecting the first segment 20a and the second segment 20b in series to each other.

As shown in FIG. 5A, the first conductive layer 52 is formed so as to extend from the main body section 56 to the first extending section 57 on the reverse surface 51b side. Therefore, in the present embodiment, the first conductive layer 52 is formed only on the reverse surface 51b side of the film base member 51. The first conductive layer 52 includes a first connection section 52a disposed on one end, a second connection section 52b disposed on the other end, and a wiring section 52c connecting the first connection section 52a and the second connection section 52b to each other. The first connection section 52a is to be connected to an external terminal (an input terminal) 62 of the power supply device 1050 (an external circuit) including a secondary cell as described later. The second connection section 52b is to be connected to the ITO film layer 25 of the first segment 20a as described later (see FIG. 8). The insulating layer 54 is formed extending from the main body section 56 to the first extending section 57 so as to partially cover the wiring section 52c extending between the first connection section 52a and the second connection section 52b. It should be noted that the insulating layer 54 is formed so as to reach the outer edge of the film base member 51, but is not limited to this configuration. It is sufficient for the insulating layer 54 to be formed so as to partially cover the wiring section 52c.

As shown in FIG. 5B, meanwhile, the second conductive layer 53 includes a wiring section 53a formed extending from the main body section 56 to the second extending section 58 on the obverse surface 51a side, a first connection section 53b (see FIG. 5A) formed in the second extending section 58 on the reverse surface 51b side, and a second connection section 53c formed at the end of the wiring section 53a located in the main body section 56. At the end of the wiring section 53a located in the second extending section 58, there is formed a through hole 51H. The insulating layer 55 is formed extending from the main body section 56 to the second extending section 58 so as to partially cover the wiring section 53a extending between the through hole 51H and the second connection section 53c. It should be noted that the insulating layer 55 is formed so as to reach the outer edge of the film base member 51, but is not limited to this configuration. It is sufficient for the insulating layer 55 to be formed so as to partially cover the wiring section 53a.

As shown in FIG. 5C, the wiring section 53a and the first connection section 53b are electrically connected to each other via the through hole 51H provided to the film base member 51. Specifically, in the present embodiment, the second conductive layer 53 is formed on the both surfaces, namely the obverse surface 51a and the reverse surface 51b, of the film base member 51. Thus, the second conductive layer 53 makes it possible to achieve electric conduction between the obverse surface 51a side and the reverse surface 51b side of the film base member 51. It should be noted that the second connection section 53c of the wiring section 53a is to be connected to the SUS substrate 21 (the reverse side electrode) of the first segment 20a as described later. The first connection section 53b is to be connected to the ITO film layer 25 (the obverse side electrode) of the second segment 20b as described later (see FIG. 8).

Figure 7:
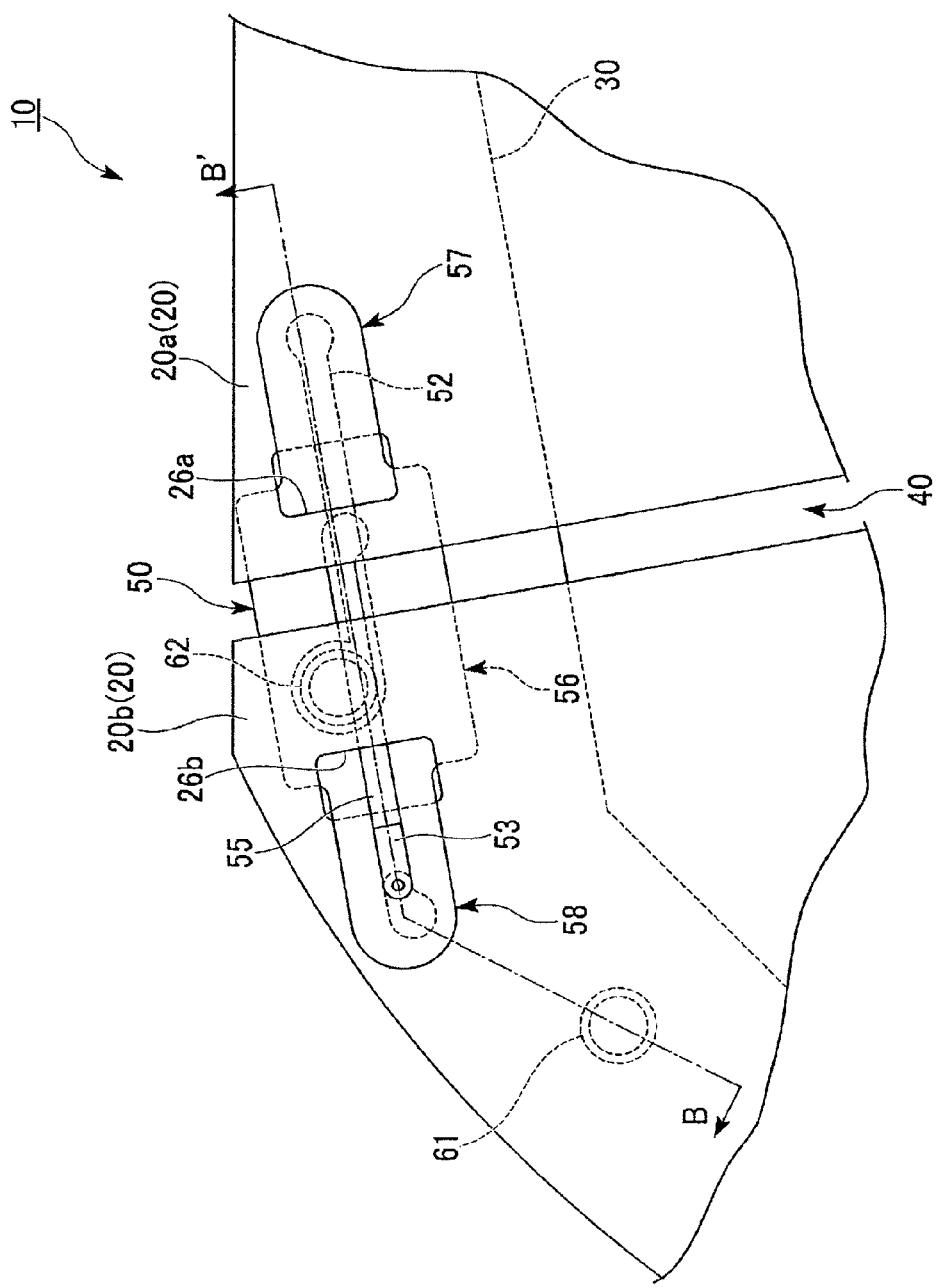
FIG. 7 is a diagram showing an installation state of the conductive member in the solar cell module according to the first embodiment.
Figure 8:
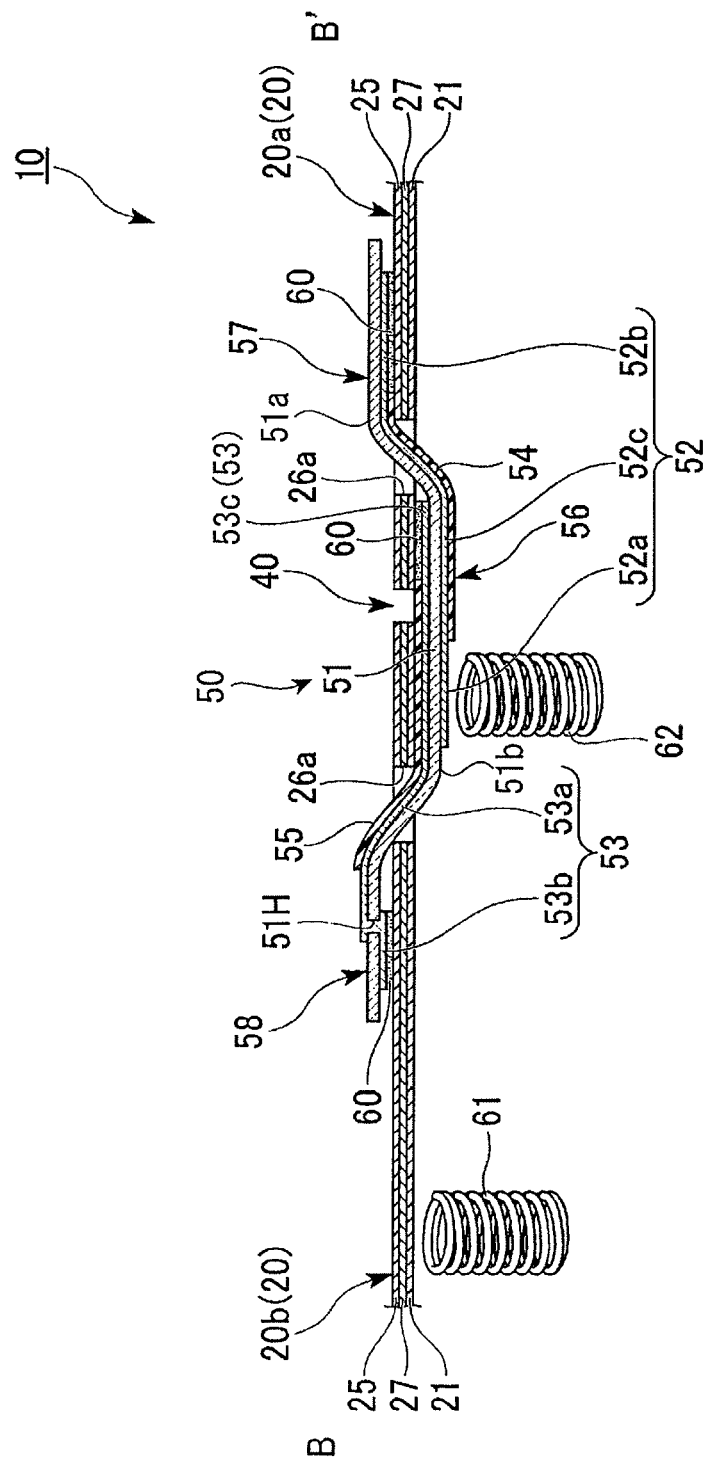
FIG. 8 is a cross-sectional view along the B-B' arrowed line shown in FIG. 7, and is a cross-sectional view showing a connection structure of the conductive member according to the first embodiment to a solar cell panel.

Based on such a configuration, the conductive member 50 is arranged to be able to connect the first segment 20a and the second segment 20b in series to each other. FIG. 7 is a diagram showing an installation state of the conductive member in the solar cell module 10. Further, FIG. 8 is a cross-sectional view along the B-B' arrowed line shown in FIG. 7, and shows a cross-section of a connection structure of the conductive member 50 to the solar cell panel 20.

As shown in FIG. 7, the conductive member 50 conductively connects (electrically connects) the first segment 20a and the second segment 20b to each other, each of which is in the state in which the obverse side (the surface provided with the ITO film layer 25) faces upward. As shown in FIG. 8, in the conductive member 50, the obverse surface 51a side of the main body section 56 is disposed so as to be opposed to the reverse side of the solar cell panel 20 when electrically connected, and the first extending section 57 is pulled out toward the obverse side of the solar cell panel 20 (the first segment 20a) via the cutout (a first cutout) 26a, and at the same time, the second extending section 58 is pulled out toward the obverse side of the solar cell panel 20 (the second segment 20b) via the cutout (a second cutout) 26b.

In the present embodiment, the conductive member 50 is formed mainly of the film base member 51, and is therefore superior in flexibility. Therefore, the conductive member 50 can easily be pulled out from the reverse side to the obverse side of the solar cell panel 20 via the cutouts 26a, 26b by bending the first extending section 57 and the second extending section 58 upward. Further, the first extending section 57 and the second extending section 58 pulled out to the obverse side of the solar cell panel 20 respectively via the cutouts 26a, 26b can easily be bent toward the upper side (the obverse side) of the first segment 20a and the second segment 20b, respectively.

In the first extending section 57 pulled out to the upper side of the first segment 20a via the cutout 26a, the second connection section 52b (the first conductive layer 52) formed on the reverse surface 51b is electrically connected to the ITO film layer 25 (the positive electrode) of the first segment 20a. In the present embodiment, the ITO film layer 25 and the second connection section 52b are electrically connected to each other via a conductive material 60 such as a conductive paste.

Further, in the first conductive layer 52, the first connection section 52a disposed on an opposite side to the second connection section 52b via the wiring section 52c is electrically connected to the external terminal (the positive terminal of the power supply device 1050) 62. The external terminal 62 is formed of, for example, a spring pin, and is set to the state of having good contact with the first connection section 52a due to a biasing force. Thus, the external terminal 62 and the first connection section 52a are provided with high conduction (connection) reliability.

Therefore, it is possible for the conductive member 50 to electrically connect the ITO film layer 25 (the positive electrode) of the first segment 20a and the external terminal 62 (an input terminal for the positive electrode) to each other with the first conductive layer 52.

Meanwhile, in the second extending section 58 pulled out to the upper side of the second segment 20b via the cutout 26b, the first connection section 53b of the second conductive layer 53 formed on the reverse surface 51b is electrically connected to the ITO film layer 25 (the positive electrode) of the second segment 20b. In the present embodiment, the ITO film layer 25 and the first connection section 53b are connected to each other via the conductive material 60 such as a conductive paste.

In the film base member 51, the obverse surface 51a of the main body section 56 is opposed to the reverse side of the first segment 20a. Therefore, the second connection section 53c of the wiring section 53a is electrically connected to the SUS substrate 21 (the negative electrode) of the first segment 20a. In the present embodiment, the second connection section 53c and the SUS substrate 21 are electrically connected to each other via the conductive material 60 such as a conductive paste.

Therefore, the conductive member 50 electrically connects the SUS substrate 21 (the negative electrode) of the first segment 20a and the ITO film layer 25 (the positive electrode) of the second segment 20b to each other with the second conductive layer 53.

Further, as shown in FIG. 8, the SUS substrate 21 (the negative electrode) of the second segment 20b is electrically connected to the external terminal (the negative terminal of the power supply device 1050) 61. The external terminal 61 is formed of, for example, a spring pin, and is set to the state of having good contact with the SUS substrate 21 of the second segment 20b due to a biasing force. Thus, the external terminal 61 and the SUS substrate 21 are provided with high conduction (connection) reliability.

In such a manner, the SUS substrate 21 of the first segment 20a and the ITO film layer 25 of the second segment 20b are electrically connected to the power supply device 1050 (an external circuit) including the secondary cell. In other words, the solar cell module 10 is electrically connected to the power supply device 1050 including the secondary cell. Thus, it is arranged that the electrical power generated by the solar cell module 10 is stored in the secondary cell in the power supply device 1050.

Incidentally, in the present embodiment, the first extending section 57 and the second extending section 58 have contact with end portions of the cutouts 26a, 26b in some cases when pulled out toward the obverse side of the solar cell panel 20 through the cutouts 26a, 26b. Here, the first segment 20a and the second segment 20b each have a structure in which the ITO film layer 25 (the positive electrode) and the SUS substrate 21 (the negative electrode) are exposed on the side end surfaces (the end portions of the cutouts 26a, 26b). Therefore, if the first conductive layer 52 or the second conductive layer 53 formed on the surface of the first extending section 57 or the second extending section 58 has contact with the end portions of the cutouts 26a, 26b, short circuit might occur.

In contrast, the conductive member 50 according to the present embodiment is provided with the insulating layer 54 for partially covering the first conductive layer 52 and the insulating layer 55 for partially covering the second conductive layer 53. In other words, in the first extending section 57 pulled out toward the obverse side of the first segment 20a via the cutout 26a, a part of the wiring section 52c is covered with the insulating layer 54. Therefore, the short circuit caused by the wiring section 52c and the end surface of the cutout 26a (the side end surface of the first segment 20a) having electrical contact with each other can be prevented from occurring.

Further, a part (a part of the wiring section 53a) of the second conductive layer 53 formed on the obverse surface 51a of the second extending section 58 pulled out via the cutout 26b is covered with the insulating layer 55. Therefore, the short circuit caused by the wiring section 53a and the end surface of the cutout 26b (the side end surface of the second segment 20b) having electrical contact with each other can be prevented from occurring. Further, the insulating layer 55 covers a part of the wiring section 53a, which is opposed to the SUS substrate 21 of the second segment 20b. Therefore, the short circuit caused by the wiring section 53a and the SUS substrate 21, namely the positive electrode and the negative electrode of the second segment 20b, having electrical contact with each other can be prevented from occurring.

As described hereinabove, according to the present embodiment, in the solar cell module 10, the first segment 20a and the second segment 20b of the solar cell panel 20 are connected in series to each other with the conductive member 50. In other words, the electrical series connection structure between the ITO film layer 25 (the positive electrode) of the first segment 20a and the SUS substrate 21 (the negative electrode) of the second segment 20b is realized by a single conductive member 50. Therefore, a reduction in the number of components, or a reduction in man-hour for the conduction operation can be achieved, and as a result, the cost reduction can be achieved. Further, since the conductive member 50 is formed mainly of the film base member 51 (a flexible base member), an arrangement of the first conductive layer 52 and the second conductive layer 53 is simply and surely performed, and thus, the conduction (connection) reliability between the first segment 20a and the second segment 20b can be improved.

The solar cell module 10 implemented in the watch 1000 is irradiated with the solar light via the watch dial 1005 having a light transmissive property when the watch dial 1005 side (+Z side) is irradiated with the solar light. Thus, the solar cell module 10 generates electrical power, and the secondary cell of the power supply device 1050 electrically connected to the solar cell module 10 is charged.

Further, according to the present embodiment, since the triple junction structure including a layer made of amorphous silicon germanium is adopted as the power-generating layer 24, even in the case of dividing the solar call panel 20 into two parts and connecting them in series to each other, a sufficient voltage can be obtained.

Therefore, according to the watch 1000 related to the present embodiment, since the watch 1000 is provided with the solar cell module 10, a high drive voltage can be obtained. Therefore, the watch 1000 as a solar watch, which can be driven with stable electrical power, and is therefore high in reliability, can be provided at low cost.

Further, as shown in FIG. 7, the cutouts 26a, 26b are disposed so as to be opposed to each other across the parting line section 40, and when connecting the first segment 20a and the second segment 20b in series to each other with the conductive member 50, the conductive member 50 does not run off the outer edges of the first segment 20a and the second segment 20b. In other words, at the position where the conductive member 50 does not run off the outer edges of the first segment 20a and the second segment 20b, the cutout 26a through which the first extending section 57 is pulled out is formed in the first segment 20a, and the cutout 26b through which the second extending section 58 is pulled out is formed in the second segment 20b.

According to this configuration, even if it is difficult to pull out the conductive member 50 from the parting line section 40 as a gap between the first segment 20a and the second segment 20b adjacent to each other, it is possible to pull out the first extending section 57 and the second extending section 58 through the cutouts 26a, 26b disposed in the respective solar cell segments to connect the first extending section 57 and the second extending section 58 to the respective obverse side electrodes of the first segment 20a and the second segment 20b. In other words, it is possible to provide the solar cell module 10 in which the first segment 20a and the second segment 20b can electrically be connected in series to each other even if the first segment 20a and the second segment 20b are disposed close to each other.

Further, the connection distance between the first segment 20a and the second segment 20b using the conductive member 50 can relatively be shortened. In other words, it is possible to provide the solar cell module 10 capable of reducing the power loss due to the interconnection resistance of the conductive member 50. Further, since the first extending section 57 is pulled out through the cutout 26a, which is a through hole having a roughly rectangular shape in the planar view, and the second extending section 58 is similarly pulled out through the cutout 26b, which is a through hole having a roughly rectangular shape in the planar view, the pull-out positions of the first extending section 57 and the second extending section 58 are difficult to shift, and therefore, there can be provided the solar cell module 10 capable of reducing the degradation of the connection reliability due to an external force.

Second Embodiment

Solar Cell Module

Secondary, a solar cell module according to a second embodiment of the invention will be explained. The difference between the present embodiment and the first embodiment is the structure of the conductive member, and the rest of the configuration is common. Therefore, in the following explanation, the same constituents as those of the first embodiment and common members will be denoted with the same reference symbols, and the detailed explanation thereof will be omitted.

Figure 9A:
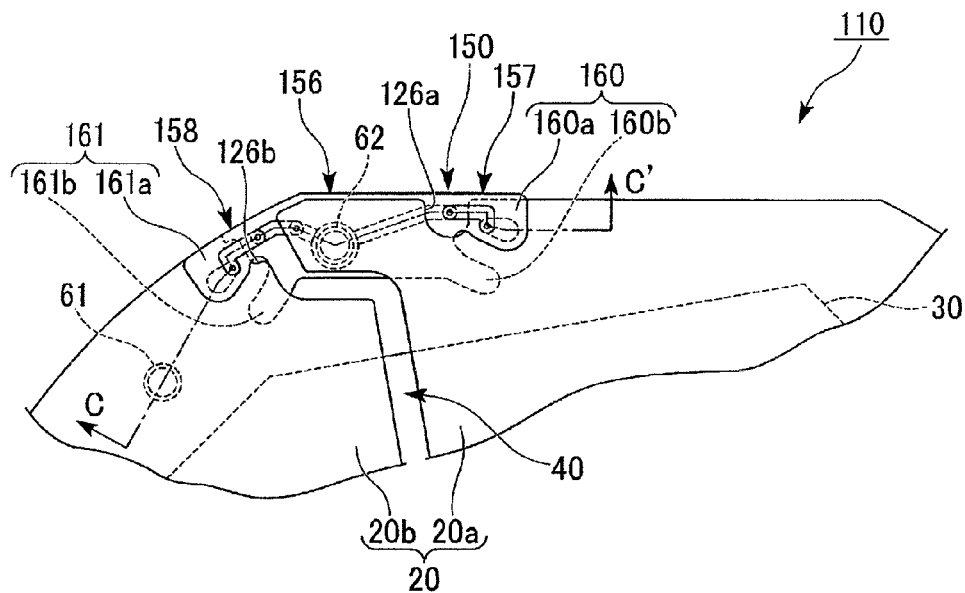
FIGS. 9A and 9B are plan views of a solar cell module according to a second embodiment of the invention.
Figure 9B:
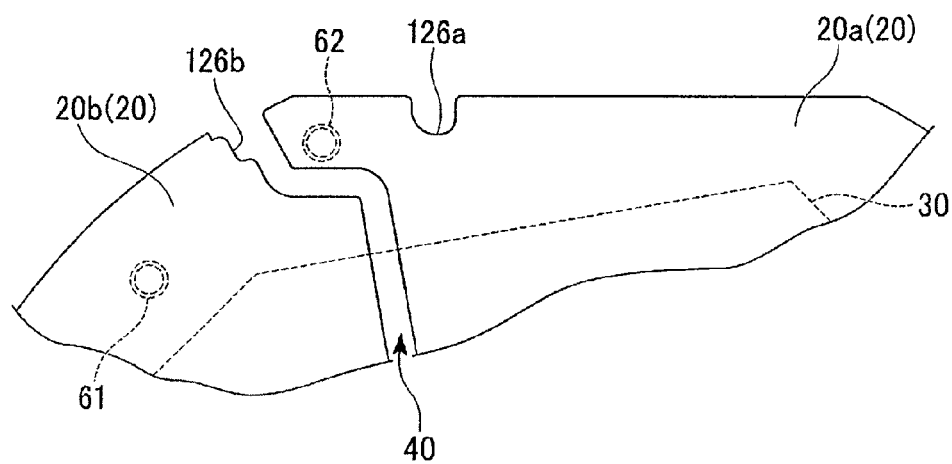

FIGS. 9A and 9B are diagrams showing a schematic configuration of the solar cell module according to the second embodiment, wherein FIG. 9A is an enlarged plan view of a principal part of the solar cell module in the state in which the conductive member is attached, and FIG. 9B is an enlarged plan view of a principal part of the solar cell module in the state in which the conductive member is removed.

As shown in FIG. 9A, the solar cell module 110 according to the present embodiment has the first segment 20a and the second segment 20b, and the first segment 20a and the second segment 20b are connected in series to each other with the conductive member 150.

The first segment 20a and the second segment 20b are respectively provided with cutouts 126a, 126b as shown in FIG. 9B. The cutouts 126a, 126b are for attaching the conductive member 150 shown in FIG. 9A.

Conductive Member

Figure 10A:
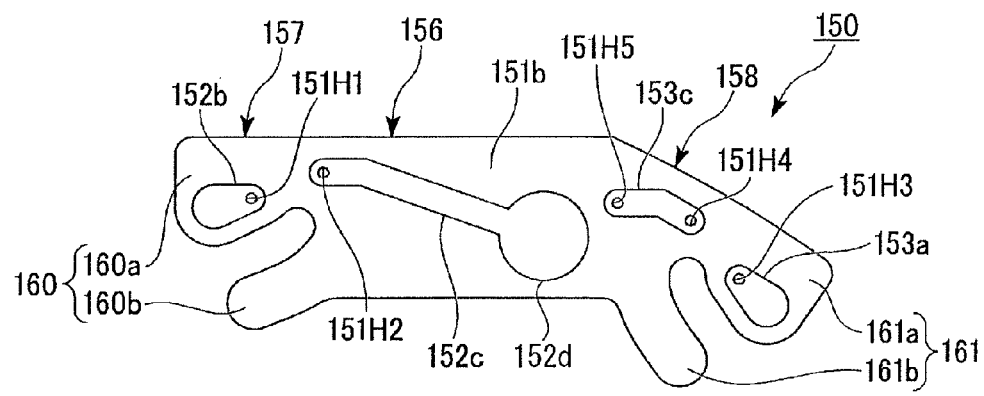
FIGS. 10A through 10C are schematic configuration diagrams of a conductive member according to the second embodiment.
Figure 10B:
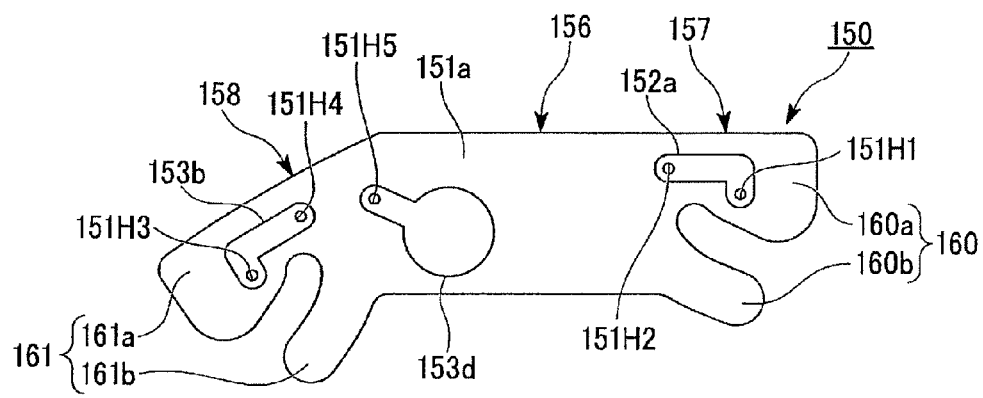
Figure 10C:
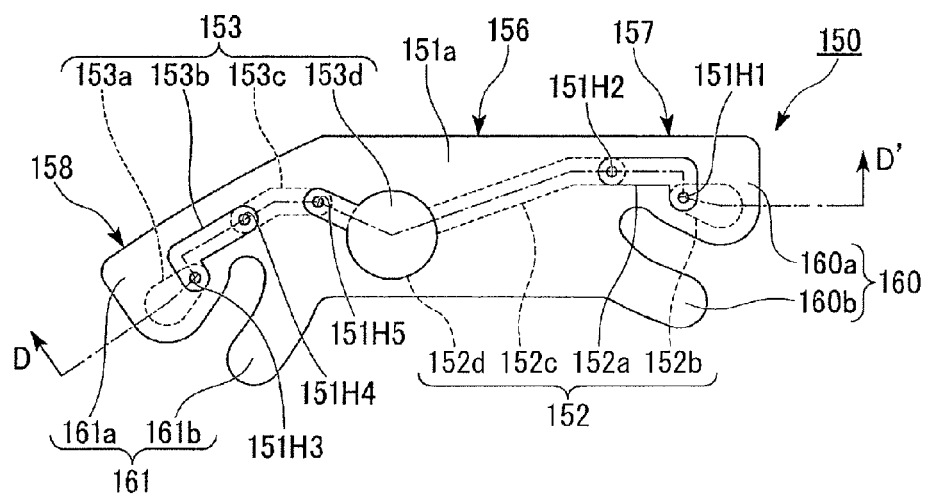
Figure 11:
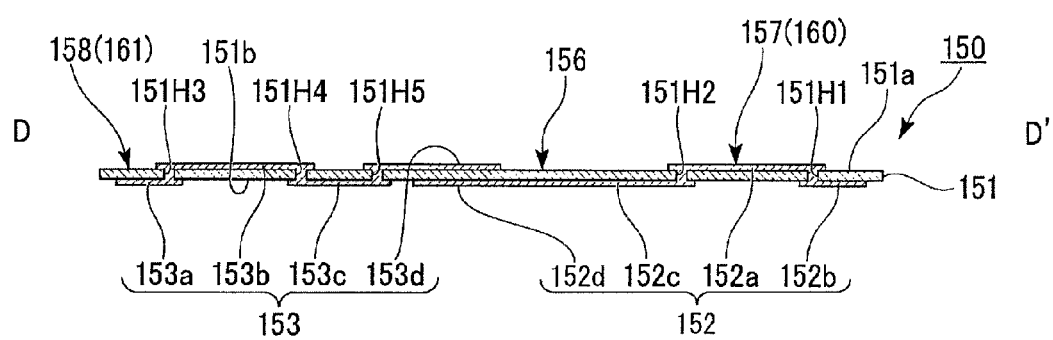
FIG. 11 is a cross-sectional view of the conductive member according to the second embodiment.
Figure 12:
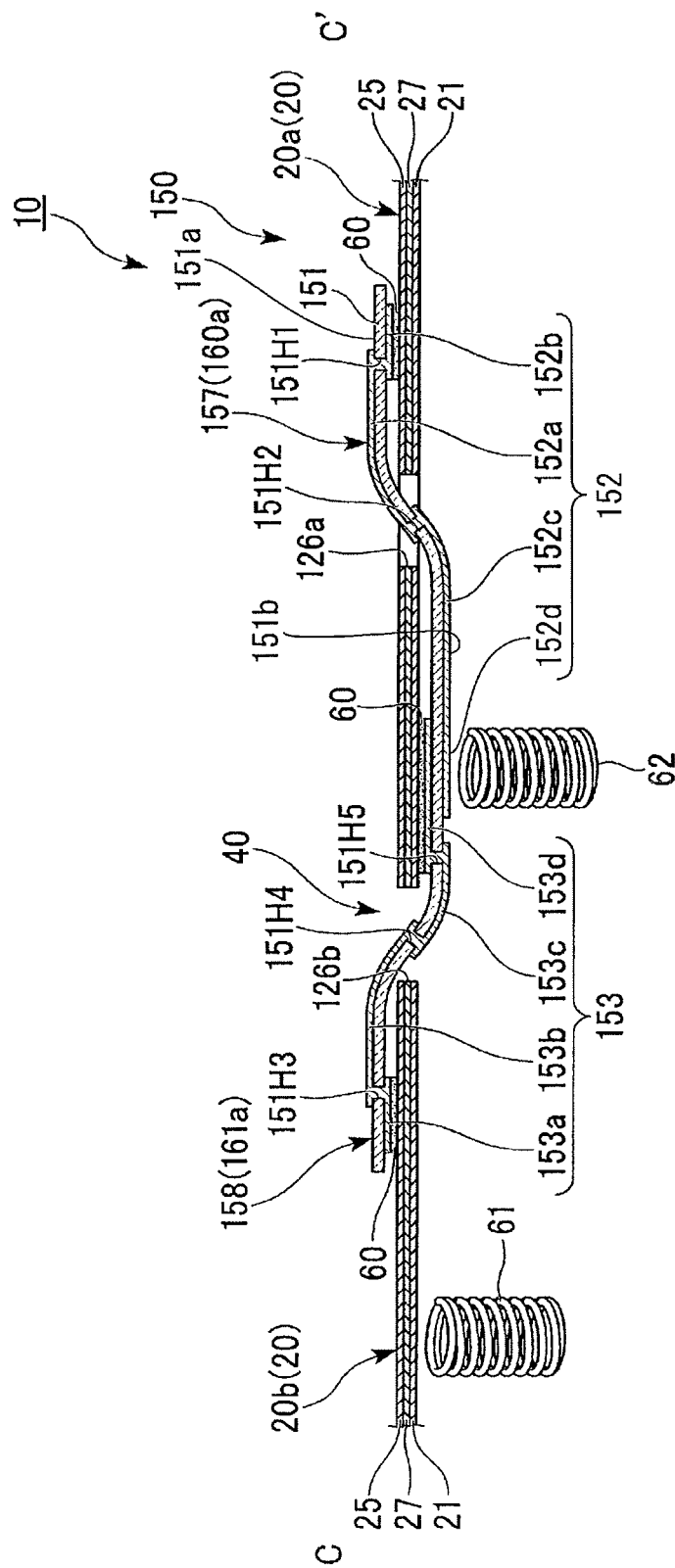
FIG. 12 is a cross-sectional view along the C-C' arrowed line shown in FIG. 9A, and is a cross-sectional view showing a connection structure of the conductive member according to the second embodiment to a solar cell panel.

FIGS. 10A through 10C are diagrams showing a configuration of the conductive member 150 according to the present embodiment, wherein FIG. 10A is a plan view of the conductive member 150 viewed from the reverse side, FIG. 10B is a plan view of the conductive member 150 viewed from the obverse side, and FIG. 10O is a diagram showing an arrangement relationship between the conductive layers on the both sides in the case of viewing the conductive member 150 from the obverse side. FIG. 11 is a diagram showing a cross-sectional configuration of the conductive member 150 along the D-D' arrowed line shown in FIG. 10O. FIG. 12 is a cross-sectional view along the C-C' arrowed line shown in FIG. 9A, and shows a cross-section of a connection structure of the conductive member 150 to the solar cell panel 20.

As shown in FIGS. 10A through 10C, and 11, the conductive member 150 is provided with a film base member 151 as a flexible base member, and a second conductive layer 153 and a first conductive layer 152 respectively drawn to the both surfaces, namely a reverse surface 151b (one surface) and an obverse surface 151a (the other surface), of the film base member 151. The first conductive layer 152 and the second conductive layer 153 are each formed of, for example, a copper foil or the like.

As shown in FIGS. 10A through 10C, the film base member 151 includes a main body section 156, and a first extending section 157 and a second extending section 158 extending from both ends of the main body section 156. As shown in FIG. 10B, the first extending section 157 extends rightward with respect to the main body section 156, and has a branched structure 160 in which the tip is branched like a fork. The branched structure 160 includes a first branch end portion 160a and a second branch end portion 160b. The second extending section 158 extends obliquely downward left with respect to the main body section 156, and has a branched structure 161 in which the tip is branched like a fork. The branched structure 161 includes a first branch end portion 161a and a second branch end portion 161b.

In the first extending section 157, only the first branch end portion 160a is pulled out toward the upper side (the obverse side) via the cutout 126a provided to the first segment 20a when connecting the first segment 20a and the second segment 20b in series to each other. Meanwhile, the second branch end portion 160b is disposed on the lower side (the reverse side) of the first segment 20a (see FIG. 9A).

Further, in the second extending section 158, only the first branch end portion 161a is pulled out toward the upper side (the obverse side) via the cutout 126b provided to the second segment 20b when connecting the first segment 20a and the second segment 20b in series to each other. Meanwhile, the second branch end portion 161b is disposed on the lower side (the reverse side) of the second segment 20b (see FIG. 9A).

As shown in FIGS. 10A through 10C, and 11, the first conductive layer 152 has a first wiring section 152a formed in the first branch end portion 160a of the first extending section 157 on the obverse surface 151a side, a first connection section 152b formed in the first branch end portion 160a of the first extending section 157 on the reverse surface 151b side, and a second wiring section 152c and a second connection section 152d formed in the main body section 156. The first connection section 152b is to be connected to the ITO film layer 25 of the first segment 20a. The second connection section 152d is to be connected to the external terminal (the input terminal) 62 of the power supply device 1050 (the external circuit) including the secondary cell as described later (see FIG. 12).

As shown in FIG. 10C, the first connection section 152b and the first wiring section 152a are electrically connected to each other via a through hole 151H1 provided to the film base member 151. Further, the first wiring section 152a and the second wiring section 152c are electrically connected to each other via a through hole 151H2 provided to the film base member 151. In the present embodiment, the first conductive layer 152 is formed on the both surfaces, namely the obverse surface 151a and the reverse surface 151b, of the film base member 151. Thus, the first conductive layer 152 makes it possible to achieve electric conduction between the obverse surface 151a side and the reverse surface 151b side of the film base member 151.

As shown in FIGS. 10A through 10C, and 11, the second conductive layer 153 has a first connection section 153a and a second wiring section 153c formed in the first branch end portion 161a of the second extending section 158 on the reverse surface 151b side, a first wiring section 153b formed in the first branch end portion 161a of the second extending section 158 on the obverse surface 151a side, and a second connection section 153d formed in the main body section 156 on the obverse surface 151a side. The first connection section 153a is to be connected to the ITO film layer 25 of the second segment 20b. The second connection section 153d is to be connected to the SUS substrate 21 of the first segment 20a, and overlaps the second connection section 152d of the first conductive layer 152 formed on the obverse surface 151a side in the planar view.

The first connection section 153a and the first wiring section 153b are electrically connected to each other via a through hole 151H3 provided to the film base member 151. Further, the first wiring section 153b and the second wiring section 153c are electrically connected to each other via a through hole 151H4 provided to the film base member 151. Further, the second wiring section 153c and the second connection section 153d are electrically connected to each other via a through hole 151H5 provided to the film base member 151. In the present embodiment, the second conductive layer 153 is formed on the both surfaces, namely the obverse surface 151a and the reverse surface 151b, of the film base member 151. Thus, the second conductive layer 153 makes it possible to achieve electric conduction between the obverse surface 151a side and the reverse surface 151b side of the film base member 151.

Based on this configuration, the second conductive layer 153 is capable of connecting the SUS substrate 21 (the negative electrode) of the first segment 20a and the ITO film layer 25 (the positive electrode) of the second segment 20b in series to each other. Further, the first conductive layer 152 is connectable to the ITO film layer 25 of the first segment 20a and the external terminal (the input terminal) 62 of the power supply device 1050 (see FIG. 12).

As shown in FIG. 12, in the conductive member 150, the obverse surface 151a side of the main body section 156 is disposed so as to be opposed to the reverse side of the solar cell panel 20 when electrically connected, and a part of the first extending section 157 is pulled out toward the obverse side of the solar cell panel 20 (the first segment 20a) via the cutout 126a, and at the same time, a part of the second extending section 158 is pulled out toward the obverse side of the solar cell panel 20 (the second segment 20b) via the cutout 126b.

Specifically, in the conductive member 150, as shown in FIG. 9A, only the first branch end portion 160a out of the first extending section 157 is pulled out toward the upper side (the obverse side), and at the same time, only the first branch end portion 161a out of the second extending section 158 is pulled out toward the upper side (the obverse side) of the solar cell panel 20 (the second segment 20b) via the cutout 126b. Meanwhile, the second branch end portion 160b of the first extending section 157 is disposed on the lower side (the reverse side) of the first segment 20a, and the second branch end portion 161b of the second extending section 158 is disposed on the lower side (the reverse side) of the second segment 20b. The first branch end portion 160a and the first branch end portion 161a formed of the film base member 151 are superior in flexibility, and can therefore easily be bent. Therefore, the first branch end portion 160a and the first branch end portion 161a can easily be pulled out from the reverse side of the solar cell panel 20 toward the obverse side via the cutouts 126a, 126b, respectively. Further, the first branch end portions 160a, 161a pulled out to the obverse side of the solar cell panel 20 respectively via the cutouts 126a, 126b can easily be bent toward the upper side of the first segment 20a and the second segment 20b, respectively.

As shown in FIGS. 9A and 12, in the first branch end portion 160a pulled out to the upper side (the obverse side) of the first segment 20a via the cutout 126a, the first connection section 152b (the first conductive layer 152) formed on the reverse surface 151b is electrically connected to the ITO film layer 25 (the positive electrode) of the first segment 20a. In the present embodiment, the ITO film layer 25 and the first connection section 152b are electrically connected to each other via the conductive material 60 such as a conductive paste. The first connection section 152b is connected to the second wiring section 152c formed on the reverse surface 151b side via the through holes 151H1, 151H2, and the first wiring section 152a, and is electrically connected to the external terminal (the positive terminal of the power supply device 1050) via the second connection section 152d provided to the second wiring section 152c.

Therefore, the conductive member 150 electrically connects the ITO film layer 25 (the positive electrode) of the first segment 20a and the external terminal 62 to each other with the first conductive layer 152.

Meanwhile, as shown in FIGS. 9A and 12, in the first branch end portion 161a pulled out to the upper side of the second segment 20b via the cutout 126b, the first connection section 153a of the second conductive layer 153 formed on the reverse surface 151b is electrically connected to the ITO film layer 25 (the positive electrode) of the second segment 20b. In the present embodiment, the ITO film layer 25 and the first connection section 153a are connected to each other via the conductive material 60 such as a conductive paste. The first connection section 153a is connected to the second connection section 153d formed on the obverse surface 151a side via the through holes 151H3, 151H4, and 151H5, the first wiring section 153b, and the second wiring section 153c, and is electrically connected to the SUS substrate 21 of the first segment 20a via the second connection section 153d.

In the present embodiment, the second connection section 153d overlaps the second connection section 152d of the first conductive layer 152 formed on the obverse surface 151a side in the planar view. In the second connection section 152d, the conductive member 150 is pressed against the reverse side of the first segment 20a due to the biasing force (stress) of the external terminal 62 formed of a spring pin. Thus, the second connection section 153d overlapping the second connecting section 152d in the planar view is pressed against the SUS substrate side of the first segment 20a due to the biasing force of the external terminal 62. Therefore, the second connection section 153d can obtain high conduction (connection) reliability with respect to the SUS substrate 21 of the first segment 20a without using the conductive material 60 such as a conductive paste.

Therefore, the conductive member 150 electrically connects the SUS substrate 21 (the negative electrode) of the first segment 20a and the ITO film layer 25 (the positive electrode) of the second segment 20b to each other with the second conductive layer 153.

Incidentally, in the present embodiment, the first extending section 157 and the second extending section 158 have contact with end portions of the cutouts 126a, 126b in some cases when pulled out toward the obverse side of the solar cell panel 20 through the cutouts 126a, 126b. Here, the first segment 20a and the second segment 20b each have a structure in which the ITO film layer 25 (the positive electrode) and the SUS substrate 21 (the negative electrode) are exposed on the side end surfaces (the end portions of the cutouts 126a, 126b). Therefore, if the first conductive layer 152 or the second conductive layer 153 provided to the first extending section 157 or the second extending section 158 has contact with the end portions of the cutouts 126a, 126b, short circuit might occur.

In contrast, in the conductive member 150 according to the present embodiment, there is adopted the configuration in which the film base member 151 is provided with the through holes 151H1, 151H2, 151H3, 151H4, and 151H5 to thereby draw the first conductive layer 152 and the second conductive layer 153 to the both sides of the film base member 151.

Specifically, in the first extending section 157 pulled out through the cutout 126a, the part (the part having a possibility of having contact with the end surface) of the first conductive layer 152, which corresponds to the end surface of the cutout 126a, is drawn to the obverse surface 151a side using the through holes 151H1, 151H2, and the first wiring section 152a. Therefore, the first conductive layer 152 has no chance of having contact with the end surface (the side end surface of the first segment 20a) of the cutout 126a, and the short circuit due to the contact between the first conductive layer 152 and the cutout 126a can be prevented from occurring.

Further, the second extending section 158 pulled out toward the obverse side via the cutout 126b and the gap of the parting line section 40 might have contact with the side end surfaces of the first segment 20a and the second segment 20b.

In the second extending section 158, the part (the part having a possibility of having contact with the end surface) of the second conductive layer 153, which corresponds to the end surface of the cutout 126b (the second segment 20b), is drawn to the obverse surface 151a side using the through holes 151H3, 151H4, and the first wiring section 153b.

Therefore, the second conductive layer 153 has no chance of having contact with the end surface (the side end surface of the second segment 20b) of the cutout 126b, and the short circuit due to the contact between the second conductive layer 153 and the cutout 126b can be prevented from occurring.

Further, in the second extending section 158, the part (the part having a possibility of having contact with the end surface) corresponding to the side end surface of the first segment 20a is drawn to the reverse surface 151b side using the through holes 151H4, 151H5, and the second wiring section 153c. Therefore, the second conductive layer 153 has no chance of having contact with the side end surface of the first segment 20a, and the short circuit due to the contact between the second conductive layer 153 and the first segment 20a can be prevented from occurring.

As described hereinabove, according to the conductive member 150 related to the present embodiment, the electrical series connection structure between the ITO film layer 25 (the positive electrode) of the first segment 20a and the SUS substrate (the negative electrode) 21 of the second segment 20b can be realized by a single member. Therefore, a reduction in the number of components, or a reduction in man-hour for the conduction operation can be achieved, and as a result, the cost reduction can be achieved.

Further, in the present embodiment, by adopting the structure in which the second connection section 153d and the second connection section 152d overlap each other in the planar view, the second connection section 153d and the SUS substrate 21 are electrically connected to each other using the biasing force (stress) of the external terminal 62. Therefore, the conductive material 60 between the second connection section 153d and the SUS substrate 21 can be made unnecessary. In this case, a further cost reduction can be achieved. Further, by adopting the structure in which the second connection section 153d and the second connection section 152d overlap each other in the planar view, the space efficiency of the conductive member 150 is improved to enhance the miniaturization, and therefore, the cost reduction can be achieved.

Further, in the present embodiment, since the first segment 20a and the second segment 20b (the solar cell panel 20) are held in good condition by the branched structures 160, 161 of the conductive member 150, there is provided conductivity high in reliability having superior resistance to an external force such as a vibration. Therefore, according to the watch equipped with the conductive member 150 related to the present embodiment, there can be obtained a solar watch high in reliability, which can be driven with low cost and stable electrical power.

Further, as shown in FIG. 9A, the cutouts 126a, 126b are disposed across the parting line section 40, and the cutout 126b is formed by cutting out the second segment 20b so as to form a part of the parting line section 40 as the gap between the first segment 20a and the second segment 20b adjacent to each other. Therefore, since it is possible to pull out the first branch end portion 161a on the second extending section 158 side using the part of the parting line section 40 provided with the cutout 126b to connect the first segment 20a and the second segment 20b in series to each other with the conductive member 150, it is possible to further shorten the connection distance between the first segment 20a and the second segment 20b compared to the first embodiment. In other words, it is possible to provide the solar cell module 110 suppressing the power loss due to the interconnection resistance of the conductive member 150.

Further, the conductive member 150 has a side portion along the outer edge of the first segment 20a and the second segment 20b adjacent to each other. Therefore, when connecting the first segment 20a and the second segment 20b to each other with the conductive member 150, there is no chance for the conductive member 150 to significantly run off the outer edge of the first segment 20a and the second segment 20b. Therefore, when connecting the first segment 20a and the second segment 20b to each other with the conductive member 150, it becomes difficult for the conductive member 150 to run off the outer edge of the first segment 20a and the second segment 20b, and thus the solar cell module 110 smaller in size can be provided.

Although the embodiments of the invention are hereinabove explained, the content of the invention is not limited to the embodiments described above, but can arbitrarily be modified within the scope or the spirit of the invention.

For example, although in the above description of the first embodiment, the configuration in which the first connection section 52a of the first conductive layer 52 to be electrically connected to the external terminal 62, and the second connection section 53c of the second conductive layer 53 to be electrically connected to the SUS substrate 21 of the first segment 20a do not overlap each other in the planar view is cited as an example, it is also possible to dispose the first connection section 52a and the second connection section 53c so as to overlap each other in the planar view similarly to the second embodiment. According to this configuration, since it is possible to electrically connect the second connection section 53c to the SUS substrate 21 (the reverse side electrode) of the first segment 20a using the biasing force (stress) of the external terminal 62, the miniaturization and the cost reduction can be realized.

Further, although in the above description of the first embodiment, the explanation is presented citing the configuration, in which the second conductive layer 53 is arranged from the obverse surface 51a side of the film base member 51 toward the reverse surface 51b side via the through hole 51H, as an example, it is not necessary to form the through hole 51H. In other words, it is also possible to bend the obverse surface 51a side of the second extending section 58, which has been pulled out toward the obverse side via the cutout 26b, so as to be opposed to the ITO film layer 25 of the second segment 20b. According to this configuration, since it becomes unnecessary to form the second conductive layer 53 so as to be drawn to the both surfaces using the through hole 51H, the cost reduction of the conductive member 50 can be achieved.

Further, although in the above description of the second embodiment, the case of providing the conductive member 150 with five through holes 151H1, 151H2, 151H3, 151H4, and 151H5 is cited as an example, the number of the through holes is not limited to five.

Further, the configuration obtained by combining the configuration of the first embodiment and the configuration of the second embodiment can be adopted as the configuration of the cutouts through which the first extending section and the second extending section of the conductive member are pulled out toward the obverse side of the solar cell panel 20. For example, it is also possible to provide a through hole as a cutout to the first segment 20a of the solar cell panel 20, and provide a cutout forming a part of the parting line section 40 to the second segment 20b. In other words, one of the two cutouts can be a through hole.

Further, the electronic apparatus to which the solar cell module 10 (the solar cell module 110) equipped with the conductive member 50 (the conductive member 150)

according to the embodiments is applied is not limited to the watch 1000 as the solar watch. For example, the solar cell module can also be applied to an information terminal such as wearable healthcare equipment or medical equipment.

What is claimed is:

1. A conductive member adapted to electrically connect a first battery cell and a second battery cell disposed adjacent to each other, each of the first battery cell and the second battery cell having a first side and a second side that are opposed to each other, an electrode being positioned on the first side and an electrode being positioned on the second side, the conductive member comprising:
   a base member having flexibility;
   a first conductive layer disposed on one surface of the base member; and
   a second conductive layer disposed on the other surface of the base member,
   the base member being bent so as to connect the first conductive layer to the first side electrode of the first battery cell, and connect the second conductive layer to the second side electrode of the first battery cell and the first side electrode of the second battery cell,
   the first battery cell being provided with a first cutout, and the second battery cell being provided with a second cutout,
   the base member including a main body section, and a first extending section and a second extending section extending from the main body section in respective directions different from each other,
   the first extending section of the base member being bent at the first cutout, and pulled out toward the first side of the first battery cell, and a part of the first conductive layer disposed on the first extending section being connected to the first side electrode of the first battery cell,
   the second extending section of the base member being bent at the second cutout, and pulled out toward the first side of the second battery cell, and a part of the second conductive layer disposed on the second extending section being connected to the first side electrode of the second battery cell, and
   the main body section of the base member being located on the second side of the first battery cell and the second battery cell between the first cutout and the second cutout, and a part of the second conductive layer disposed on the main body section being connected to the second side electrode of the first battery cell.

2. The conductive member according to claim 1, wherein the first conductive layer and the second conductive layer are covered with an insulating layer in at least a part where the base member is bent.

3. The conductive member according to claim 1, wherein the first battery cell and the second battery cell are each a solar cell segment.

4. A solar watch comprising:
   a solar cell module including a pair of solar cell segments, and the conductive member according to claim 3 adapted to connect the pair of solar cell segments in series to each other; and
   a drive section driven with electrical power from the solar cell module.

5. The solar watch according to claim 4, wherein the conductive member is disposed in a state of being pulled out to both of the sides of the pair of solar cell segments via cutouts provided respectively to the pair of solar cell segments.

6. The solar watch according to claim 4, further comprising:
   a power supply device including a secondary cell,
   wherein the first conductive layer connected to the first side electrode of one of the pair of solar cell segments, and the second side electrode of the other of the pair of solar cell segments are connected to the power supply device so as to be able to charge the secondary cell.

7. A conductive member adapted to electrically connect a first battery cell and a second battery cell disposed adjacent to each other, each of the first battery cell and the second battery cell having a first side and a second side that are opposed to each other, an electrode being positioned on the first side and an electrode being positioned on the second side, the conductive member comprising;
   a base member having flexibility;
   a first conductive layer disposed on one surface of the base member; and
   a second conductive layer disposed on the other surface of the base member,
   the base member being bent so as to connect the first conductive layer to the first side electrode of the first battery cell, and connect the second conductive layer to the second side electrode of the first battery cell and the first side electrode of the second battery cell, and
   at least one of the first conductive layer and the second conductive layer being connected to one of the first side electrode of the first battery cell, the first side electrode of the second battery cell, and both of the first side electrode of the first battery cell and the first side electrode of the second battery cell via at least one through hole provided to the base member.

8. A solar cell module comprising:
   a first solar cell segment and a second solar cell segment disposed adjacent to each other, each of the first solar cell segment and the second solar cell segment having a first side and a second side that are opposed to each other, an electrode being positioned on the first side and an electrode being positioned on the second side; and
   a conductive member including a base member having flexibility, a first conductive layer disposed on one surface of the base member, and a second conductive layer disposed on the other surface of the base member,
   the base member being bent so as to connect the first conductive layer to the first side electrode of the first solar cell segment, and connect the second conductive layer to the second side electrode of the first solar cell segment and the first side electrode of the second solar cell segment;
   a first cutout provided to the first solar cell segment; and
   a second cutout provided to the second solar cell segment,
   the base member including a main body section, and a first extending section and a second extending section extending from the main body section in respective directions different from each other,
   the first extending section of the base member being bent at the first cutout, and pulled out toward the first side of the first solar cell segment, and a part of the first conductive layer disposed on the first extending section being connected to the first side electrode of the first solar cell segment,
   the second extending section of the base member being bent at the second cutout, and pulled out toward the first side of the second solar cell segment, and a part of the second conductive layer disposed on the second extending section being connected to the first side electrode of the second solar cell segment, and the main body section of the base member being located on the second side of the first solar cell segment and the second solar cell segment between the first cutout and the second cutout, and a part of the second conductive layer disposed on the main body section being connected to the second side electrode of the first solar cell segment.

9. The solar cell module according to claim 8, wherein the first cutout and the second cutout are disposed across a gap between the first solar cell segment and the second solar cell segment adjacent to each other.

10. The solar cell module according to claim 9, wherein the second cutout forms a part of the gap between the first solar cell segment and the second solar cell segment adjacent to each other.

11. An electronic apparatus comprising:
the solar cell module according to claim 10.

12. An electronic apparatus comprising:
the solar cell module according to claim 9.

13. The solar cell module according to 8, wherein at least one of the first cutout and the second cutout is a hole penetrating one of the first solar cell segment, the second solar cell segment, and both of the first solar cell segment and the second solar cell segment.

14. An electronic apparatus comprising:
the solar cell module according to claim 13.

15. The solar cell module according to claim 8, wherein
the first extending section and the second extending section each have a first branch end portion and a second branch end portion,
the first branch end portion of the first extending section is pulled out toward the first side of the first solar cell segment through the first cutout, and a part of the first conductive layer disposed on the first branch end portion is connected to the first side electrode of the first solar cell segment,
the first branch end portion of the second extending section is pulled out toward the first side of the second solar cell segment through the second cutout, and a part of the second conductive layer disposed on the first branch end portion is connected to the first side electrode of the second solar cell segment, and
the second branch end portions of the first extending section and the second extending section are disposed on the second side of the first solar cell segment and the second solar cell segment adjacent to each other.

16. The solar cell module according to claim 8, wherein the conductive member has a side section having a shape along outer edges of the first solar cell segment and the second solar cell segment adjacent to each other.

17. An electronic apparatus comprising:
solar cell module according to claim 8.

18. An electronic apparatus comprising:
the solar cell module according to claim 8.

* * * * *